US 11,899,873 B2

(12) United States Patent
Reuss et al.

(10) Patent No.: US 11,899,873 B2
(45) Date of Patent: Feb. 13, 2024

(54) TEMPERATURE-COMPENSATED TOUCH SENSING

(71) Applicant: Sensata Technologies, Inc., Attleboro, MA (US)

(72) Inventors: James A. Reuss, Burnsville, MN (US); Eric J. Minnaert, Robbinsdale, MN (US); Paul R. Erickson, Prior Lake, MN (US)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 0 days.

(21) Appl. No.: 17/940,215

(22) Filed: Sep. 8, 2022

(65) Prior Publication Data

US 2023/0080125 A1    Mar. 16, 2023

Related U.S. Application Data

(60) Provisional application No. 63/242,586, filed on Sep. 10, 2021.

(51) Int. Cl.
*G06F 3/041* (2006.01)
*G06F 3/044* (2006.01)

(52) U.S. Cl.
CPC ........ *G06F 3/04164* (2019.05); *G06F 3/0418* (2013.01); *G06F 3/0445* (2019.05)

(58) Field of Classification Search
CPC .... G06F 3/04164; G06F 3/041; G06F 3/0418; G06F 3/044; G06F 3/0445
See application file for complete search history.

(56) References Cited

U.S. PATENT DOCUMENTS

| 9,454,229 | B1* | 9/2016 | Wellen | G06F 3/041 |
| 10,606,411 | B2 | 3/2020 | Rouaissia et al. | |
| 2010/0240415 | A1* | 9/2010 | Kim | G06F 21/32 |
| | | | | 455/565 |
| 2013/0222291 | A1* | 8/2013 | You | G06F 3/0418 |
| | | | | 345/173 |

(Continued)

OTHER PUBLICATIONS

European Search Report issued in related Application Serial No. 22194976.1-1216 dated Jan. 30, 2023.

*Primary Examiner* — Md Saiful A Siddiqui
(74) *Attorney, Agent, or Firm* — Mark H. Whittenberger; Holland & Knight LLP (57) ABSTRACT

Embodiments included herein are directed towards a method for determining a temperature-compensated touch state of a device, and related systems. The method may include receiving, by a processor of the device and from a first sensor of the device, a first measured value corresponding to a first sensor measurement captured by the first sensor. The method may further include receiving, by the processor and from a temperature sensor of the device, a temperature value corresponding to a first temperature measurement associated with the device and captured by the temperature sensor. The method may also include adjusting a signal corresponding to the first sensor measurement based upon, at least in part, the temperature value, to create a temperature-compensated touch signal. The method may additionally include determining, by the processor, the temperature-compensated touch state of the device based upon, at least in part, the temperature-compensated touch signal.

15 Claims, 5 Drawing Sheets

(56) References Cited

U.S. PATENT DOCUMENTS

| | | | |
|---|---|---|---|
| 2013/0321297 A1* | 12/2013 | Li | G06F 3/04883 |
| | | | 345/173 |
| 2015/0015539 A1* | 1/2015 | Fotopoulos | G06F 3/0446 |
| | | | 345/174 |
| 2016/0195964 A1* | 7/2016 | Land | G06F 3/0418 |
| | | | 345/174 |
| 2018/0067601 A1 | 3/2018 | Winokur et al. | |
| 2019/0018543 A1* | 1/2019 | Yang | G06F 3/0418 |
| 2020/0363553 A1* | 11/2020 | Min | G01D 5/24 |

* cited by examiner

TEMPERATURE-COMPENSATED TOUCH SENSING

CROSS REFERENCE TO RELATED APPLICATIONS

This application claims the benefit of U.S. Provisional patent application having Ser. No. 63/242,586, filed 10 Sep. 2021, the entire content of which is incorporated herein by reference.

BACKGROUND

Devices may be used in various industries to control machinery or equipment. The devices may incorporate safety features. The safety features incorporated in the devices may prevent unintended use or operation of the machinery or equipment. The safety features may include locking or unlocking the device, machinery, or equipment based on detecting (e.g., via one or more sensing devices) the presence of a user or operator of the device. In some cases, detection capabilities for detecting the presence of the user or operator may not be reliable.

For example, a detection capability (such as a sensing device) may indicate the presence of the user or operator when the user or operator is not present. This may lead to unintentional deactivation of a corresponding safety feature (e.g., unintentional unlocking of the device), which may cause mistake or injury. Additionally or alternatively, the detection capability may indicate that the user or operator is not present when the user or operator is present. This may lead to unintentional activation of a corresponding safety feature (e.g., unintentional locking of the device), which may cause user or operator frustration or delay.

SUMMARY OF THE DISCLOSURE

As will be discussed in greater detail below, embodiments of the present disclosure are directed towards systems and methods for temperature-compensated touch sensing. Embodiments of the present disclosure may include a method for determining a temperature-compensated touch state of a device. The method may include receiving, by a processor of the device and from a first sensor of the device, a first measured value corresponding to a first sensor measurement captured by the first sensor. The method may further include receiving, by the processor and from a temperature sensor of the device, a temperature value corresponding to a first temperature measurement associated with the device and captured by the temperature sensor. The method may also include adjusting a signal corresponding to the first sensor measurement based upon, at least in part, the temperature value, to create a temperature-compensated touch signal. The method may additionally include determining, by the processor, the temperature-compensated touch state of the device based upon, at least in part, the temperature-compensated touch signal.

Some or all of the following features may be included. The method may include setting, by the processor, an operation state of the device based upon, at least in part, the temperature-compensated touch state. The method may further include determining, by the processor, that the temperature-compensated touch signal is representative of a touched state of the device base upon, at least in part, a touched threshold. The method may also include indicating that the device is touched. The method may additionally include unlocking the device based upon, at least in part, the indicating that the device is touched. Furthermore, the method may include determining, by the processor, that the temperature-compensated touch signal is representative of an untouched state of the device base upon, at least in part, an untouched threshold. Moreover, the method may include indicating that the device is untouched. Also, the method may include locking the device based upon, at least in part, the indicating that the device is untouched. The first sensor may be a capacitive touch sensor and the first measured value may be a capacitive value. The device may be an operator-controlled device. The setting of the operation state of the device based upon, at least in part, the temperature-compensated touch state may be performed during a start-up of the device. The creating of the temperature-compensated touch signal may compensate for a temperature drift associated with the first sensor.

In an embodiment, a system for determining a temperature-compensated touch state of a device may include a first sensor of the device for capturing a first sensor measurement. The system may further include a temperature sensor of the device for capturing a first temperature measurement associated with the device. The system may also include a processor of the device. The processor may be configured to receive, from the first sensor, a first measured value corresponding to the first sensor measurement. The professor may be further configured to receive, from the temperature sensor, a temperature value corresponding to the first temperature measurement associated with the device. The processor may also be configured to cause a signal corresponding to the first sensor measurement to be adjusted based upon, at least in part, the temperature value, to create a temperature-compensated touch signal. The processor may additionally be configured to determine the temperature-compensated touch state of the device based upon, at least in part, the temperature-compensated touch signal.

Some or all of the following features may be included. The processor may be configured to change a setting of the device based upon, at least in part, the temperature compensated touch state. The processor may be further configured to determine, by the processor, that the temperature-compensated touch signal is representative of a touched state of the device base upon, at least in part, a touched threshold. The processor may also be configured to indicate that the device is touched. The processor may additionally be configured to cause the device to be unlocked based upon, at least in part, the indication that the device is touched. Furthermore the processor may be configured to determine that the temperature-compensated touch signal is representative of an untouched state of the device base upon, at least in part, an untouched threshold. Moreover, the processor may be configured to indicate that the device is untouched. Further, the processor may be configured to cause the device to be locked based upon, at least in part, the indication that the device is untouched. The first sensor may be a capacitive touch sensor and the first measured value may be a capacitive value. The device may be an operator-controlled device. The setting of the operation state of the device based upon, at least in part, the temperature-compensated touch state may be performed during a start-up of the device.

In an embodiment, a method for setting a lock state of an operator-controlled device may include receiving, by a processor of the operator-controlled device and from a capacitive touch sensor of the operator-controlled device, a capacitive value corresponding to a capacitive sensor measurement captured by the capacitive touch sensor. The method may further include receiving, by the processor and from a temperature sensor of the operator-controlled device, a temperature value corresponding to a first temperature measurement associated with the operator-controlled device and captured by the temperature sensor. The method may also include adjusting a signal corresponding to the capacitive sensor measurement based upon, at least in part, the temperature value, to create a temperature-compensated touch signal. The method may additionally include determining, by the processor, the temperature-compensated capacitive touch state of the operator-controlled device based upon, at least in part, the temperature-compensated touch signal. Furthermore, the method may include setting, by the processor, a lock state of the operator-controlled device based upon, at least in part, the temperature-compensated capacitive touch state during a start-up of the operator-controlled device.

The details of one or more example implementations are set forth in the accompanying drawings and the description below. Other possible example features and/or possible example advantages will become apparent from the description, the drawings, and the claims. Some implementations may not have those possible example features and/or possible example advantages, and such possible example features and/or possible example advantages may not necessarily be required of some implementations.

This summary is provided to introduce a selection of concepts that are further described below in the detailed description. This summary is not intended to identify essential features of the claimed subject matter, nor is it intended to be used as an aid in limiting the scope of the claimed subject matter.

BRIEF DESCRIPTION OF THE DRAWINGS

Embodiments of the present disclosure are described with reference to the following figures.

Like reference symbols in the various drawings may indicate like elements.

DETAILED DESCRIPTION

The discussion below is directed to certain implementations. It is to be understood that the discussion below is only for the purpose of enabling a person with ordinary skill in the art to make and use any subject matter defined now or later by the patent "claims" found in any issued patent herein.

It is specifically intended that the claimed combinations of features not be limited to the embodiments and/or implementations and illustrations contained herein, but include modified forms of those implementations including portions of the implementations and combinations of elements of different implementations as come within the scope of the following claims. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the claimed invention unless explicitly indicated as being "critical" or "essential."

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered a same object or step.

The Assignee of the present application has described a capacitive touch technology on grip surfaces (e.g., of an operator-controlled device such as a joystick, for use with a safety-interlock application) in U.S. Pat. No. 6,590,171, the entire content of which is herein incorporated by reference. Accordingly, a corresponding machine or piece of equipment may only respond when a capacitive touch sensor verifies that a user or operator is holding an associated grip (e.g., by detecting the user's touch). As discussed above, detection capabilities for detecting the presence of a user or operator (e.g., touching or holding an operator-controlled device such as a joystick of grip thereof) may not be reliable.

For example, a sensor may indicate the presence of the user or operator when the user or operator is not present (e.g., is not touching the grip) or may indicate that the user or operator is not present when the user or operator is present (e.g., is touching the grip), either of which may lead to undesirable outcomes. This may be due to some sensors, such as capacitive touch sensors, having an inherent temperature drift. Some capacitive touch sensors may be used to detect a momentary touch and may use a weighted average of previous sensor capacitance measurements that indicated an untouched state (e.g., indicated that the user or operator was not touching the operator-controlled device) to update a reference untouched signal value to adjust for a low temperature gradient signal drift. This may be referred to as a temperature drift correction, which may work in some cases because low frequency temperature shifts may be averaged out, while high frequency momentary touch signals may remain.

However, capacitive touch sensing to detect a presence of, e.g., the user or operator's hand on the operator-controlled device (e.g., a joystick) may have a use-case of rapid temperature change during a long-duration touch. For example, a cold joystick held by the operator's warm hand may increase a temperature corresponding to a zone of the capacitive touch sensor (e.g., on the joystick or grip thereof) and may cause a signal shift that is significant relative to a signal increase corresponding to the presence of the operator's hand.

Some approaches to correct for temperature drift may apply a temperature compensation algorithm only while in the touch state, and may have an additional failure mode that may lead to a safety-interlock application detecting a touch state (e.g., the corresponding machinery or equipment may be set to respond to operator inputs from the operator-controlled device) when an operator-controlled device should register an untouched state. Other approaches may apply the temperature compensation algorithm only while in the touch state, and may have an additional failure mode that may lead to the safety-interlock application detecting the untouched state (e.g., the corresponding machinery or equipment may be set not to respond to operator inputs from the operator-controlled device) when the operator-controlled device should register a touched state (which may lead to frustration or annoyance for the operator). Further, other approaches may apply the temperature compensation algorithm only while in the touch state, but the algorithm may not be robust enough to compensate for higher rates of operator-controlled device temperature change when the device is untouched. Thus, the additional failure modes may lead to both unintended bypassing of the safety-interlock application and/or operator frustration/annoyance due to a valid touch from the operator being left undetected.

In other words, approaches that use temperature compensation algorithms only in the touched state to update a corresponding unlatch criterion may risk immediately returning to a touched state when transitioning to an untouched state because a corresponding signal after the touch (e.g., by the user or operator) has ended may be significantly higher or greater in energy or magnitude, from a corresponding grip temperature increase, than an associated pre-touch baseline. As a result, these approaches may potentially bypass the safety-interlock application of the corresponding system. A reverse or opposite situation may occur when a warm or hot grip (e.g., of the joystick) is caused to cool by the operator's hand. The failure mode may cause the operator-controlled device (e.g., the joystick) to be temporarily latched in the untouched state which, again, may result in operator frustration/annoyance.

Using the techniques and features described by the present disclosure, an active temperature compensation algorithm may be used to prevent a touch detection output from becoming latched, which may occur if the operator removes their hand after warming the operator-controlled device (e.g., the joystick) and a corresponding signal drop from the removal of the operator's hand (e.g., the joystick no longer being touched) is not large enough to meet the criterion to change from a touched to an untouched state, which may be due to a temperature increase caused by the operator's grip.

For example, embodiments of the present disclosure may include a temperature compensation algorithm that measures a value (e.g., a capacitive touch sensor value), measures a temperature, compensates the measured value (e.g., by adjusting or compensating a corresponding signal) based on a pre-characterization of a temperature drift of a corresponding sensor that measured the value, and uses the resulting temperature-compensated signal to make a touch state determination. The temperature compensation algorithm may be applied to many, most, or even every measured value (e.g., capacitive touch sensor value) before determining the corresponding touch state (e.g., touched or untouched). The temperature compensation algorithm may be used, for example, within an operator-controlled device (e.g., a joystick grip) as a safety-interlock application, and the machinery or equipment being controlled may only respond to operator-controlled device outputs (e.g., a joystick button or position outputs) when the capacitive touch sensor(s) detect a valid touch state from the operator (e.g., indicating that a user is holding the grip of the joystick).

Further, embodiments of the present disclosure may provide advantages over existing approaches by performing temperature compensation from startup of the operator-controlled device and may modify the sensor (e.g., capacitive touch sensor) signal instead of modifying criteria used to determine the touch state. The temperature compensation may be constant to limit compensated signal drift from temperature and eliminate potentially bypassing the safety-interlock application of the system (e.g., which may result from reporting a touch when none is present and immediately transitioning to an untouched state). An untouched state baseline that may be used for momentary touch (e.g., operator-controlled) devices may be calculated from signal values when, for example, a corresponding device is not touched, which may help to reduce temperature compensation accuracy error.

As will be further described below, a process described herein may measure a capacitive value and a temperature corresponding to an operator-controlled device. The process may further compensate a signal corresponding to the measured capacitive value based on the temperature measurement and a previous sensor characterization related to the temperature, then determine a touch state based on the compensated signal relative to a baseline value corresponding to an untouched state. If the compensated signal minus a baseline delta is above a touch threshold, then a zone corresponding to the capacitive touch sensor may be reported as touched. Further, when the operator controlled-device is in a touched state, the signal representing the capacitive value may first be compensated for temperature, and the compensated signal minus the baseline delta may be compared to an untouched threshold. If the delta is below the untouched threshold, then the zone corresponding to the capacitive touch sensor may be is reported as untouched.

Figure 1:
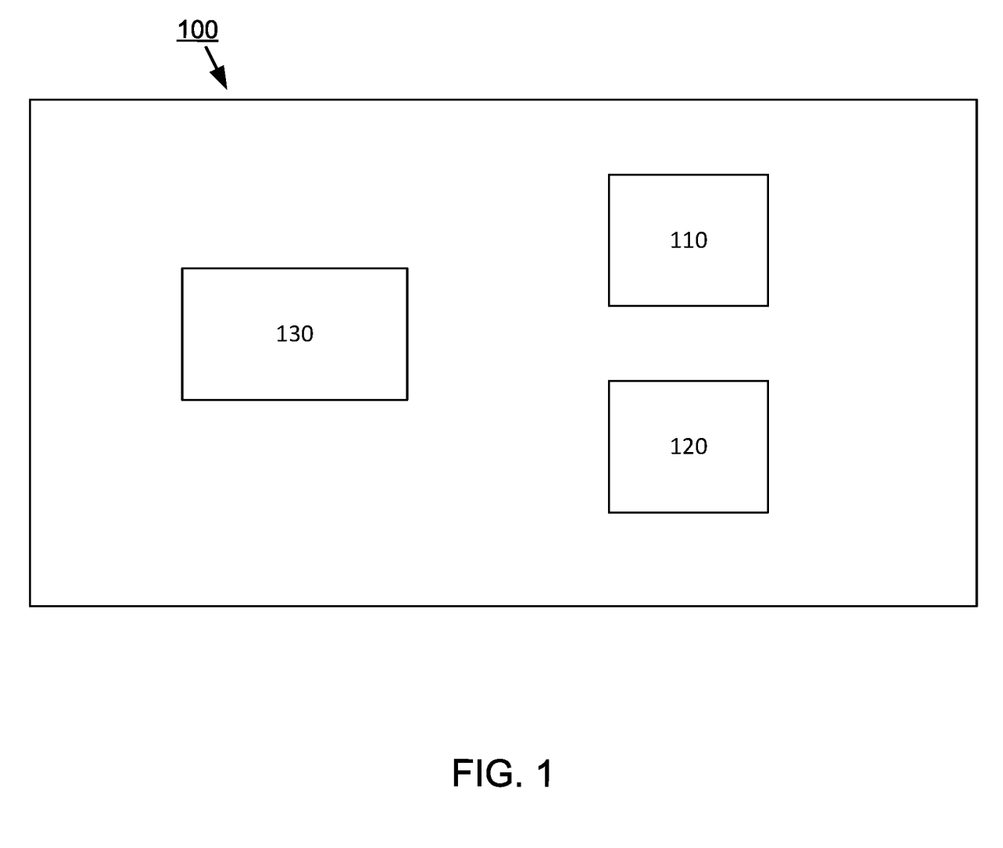
FIG. 1 illustrates an example system in accordance with embodiments of the present disclosure.

Referring to FIG. 1 an example system 100 in accordance with embodiments of the present disclosure of the present disclosure is shown. In an embodiment, the system 100 may be for determining a temperature-compensated touch state of a device (e.g., an operator controlled device) and may include a first sensor 110 of the device for capturing a first sensor measurement. The first sensor 110 may be a capacitive touch sensor and the first measured value may be a capacitive value.

In embodiments, the first sensor 110 may be part of a sensing device that includes a housing. Further, the first sensor 110 may be a capacitive touch sensor and may be mounted to the housing. The sensing device may be configured to transmit a temperature signal, where the temperature signal may include a temperature measurement of or associated with the capacitive touch sensor. Further, the sensing device may include the processor 130, which may be in communication with the capacitive touch sensor. The processor 130 may be configured to receive the temperature signal and perform a temperature compensation. The processor 130 may further be configured to perform the temperature compensation corresponding to the temperature measurement from a startup of the capacitive touch sensor or the operator-controlled device. As discussed above, the temperature compensation may modify the signal representing the capacitive value.

The system 100 may further include a temperature sensor 120 of the device for capturing a first temperature measurement associated with the device (e.g., the operator controlled device). The system 100 may also include the processor 130. One or more of the first sensor 110, the temperature sensor 120, and the processor 130 may be implemented (at least in part) via an integrated circuit. The system 100 may be part of an operator-controlled device The processor 130 may be configured to receive, from the first sensor 110 (e.g., a capacitive touch sensor), a first measured value corresponding to the first sensor measurement. The processor 130 may be further configured to receive, from the temperature sensor 120, a temperature value corresponding to the first temperature measurement associated with the device. The processor 130 may also be configured to cause a signal corresponding to the first sensor measurement (e.g., measurement by the capacitive touch sensor) to be adjusted based upon, at least in part, the temperature value, to create a temperature-compensated touch signal. The processor 130 may additionally be configured to determine the temperature-compensated touch state of the device (e.g., the operator controlled device) based upon, at least in part, the temperature-compensated touch signal.

In embodiments, the processor 130 may be configured to change a setting of the device based upon, at least in part, the temperature compensated touch state. The processor 130 may be further configured to determine that the temperature-compensated touch signal is representative of a touch or touched state of the device base upon, at least in part, a touched threshold. The processor 130 may also be configured to indicate that the device is touched. The indication may be a communication sent and received between components of the system. The processor 130 may additionally be configured to cause the device to be unlocked (i.e., the device inputs may be used to control associated machinery or equipment) based upon, at least in part, the indication that the device is touched. Furthermore, the processor 130 may be configured to determine that the temperature-compensated touch signal is representative of an untouched state of the device base upon, at least in part, an untouched threshold. Moreover, the processor 130 may be configured to indicate that the device is untouched. The indication may be a communication sent and received between components of the system. Further, the processor 130 may be configured to cause the device to be locked (i.e., the device inputs may not be used to control associated machinery or equipment) based upon, at least in part, the indication that the device is untouched. The setting of the operation state (e.g., locked or unlocked) of the device based upon, at least in part, the temperature-compensated touch state may be performed during a start-up of the device (e.g., the operator controlled device).

Figure 2:
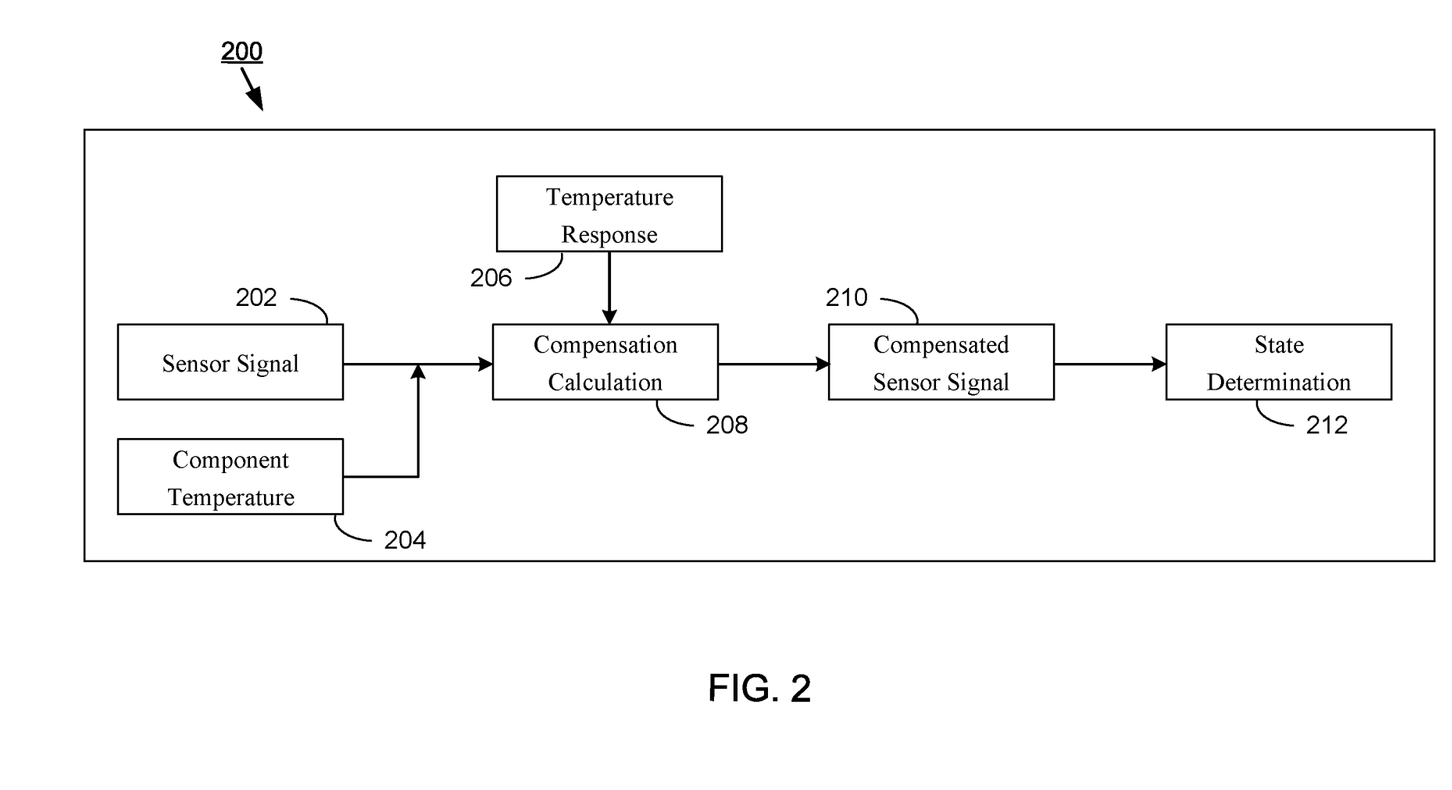
FIG. 2 illustrates an example flowchart in accordance with embodiments of the present disclosure.

Referring to FIG. 2 an example flowchart in accordance with embodiments of the present disclosure is shown. One or more of the operations shown in process 200 of FIG. 2 may be performed by the system 100 and/or the processor 130 of FIG. 1. For example, a sensor signal 202 (e.g., a capacitance sensor signal associated with a capacitive touch sensor) may be a live input to a compensation calculation operation 208 (e.g., that may be performed by the processor 130). The sensor signal 202 may be provided by the first sensor 110 or based on measurements made by the first sensor 110. Further, a component temperature 204 may be a live input to the compensation calculation operation 202. The component temperature may be provided by the temperature sensor 120 or based on measurements made by the temperature sensor 120. The live inputs may be utilized in the compensation calculation operation 208 along with a characterized temperature response 206. The characterized temperature response 206 may be previously determined based on experiment and prior temperature drift data associated with the sensor. The characterized temperature response 206 may include a slope and/or an offset table based correction. In some embodiments, the capacitance sensor signal (e.g., sensor signal 202), component temperature 204, and the characterized temperature response 208 may be utilized in the compensation calculation operation 208. The compensation calculation operation 208 may result in a compensated sensor signal 210. The compensated sensor signal 210 may lead to a state determination 212 (e.g., corresponding to a zone of an operator controlled device). The state determination 212, as explained above, may include identifying which zone and/or zones of the sensor (e.g., the capacitive touch sensor) is touched or untouched.

Figure 3:
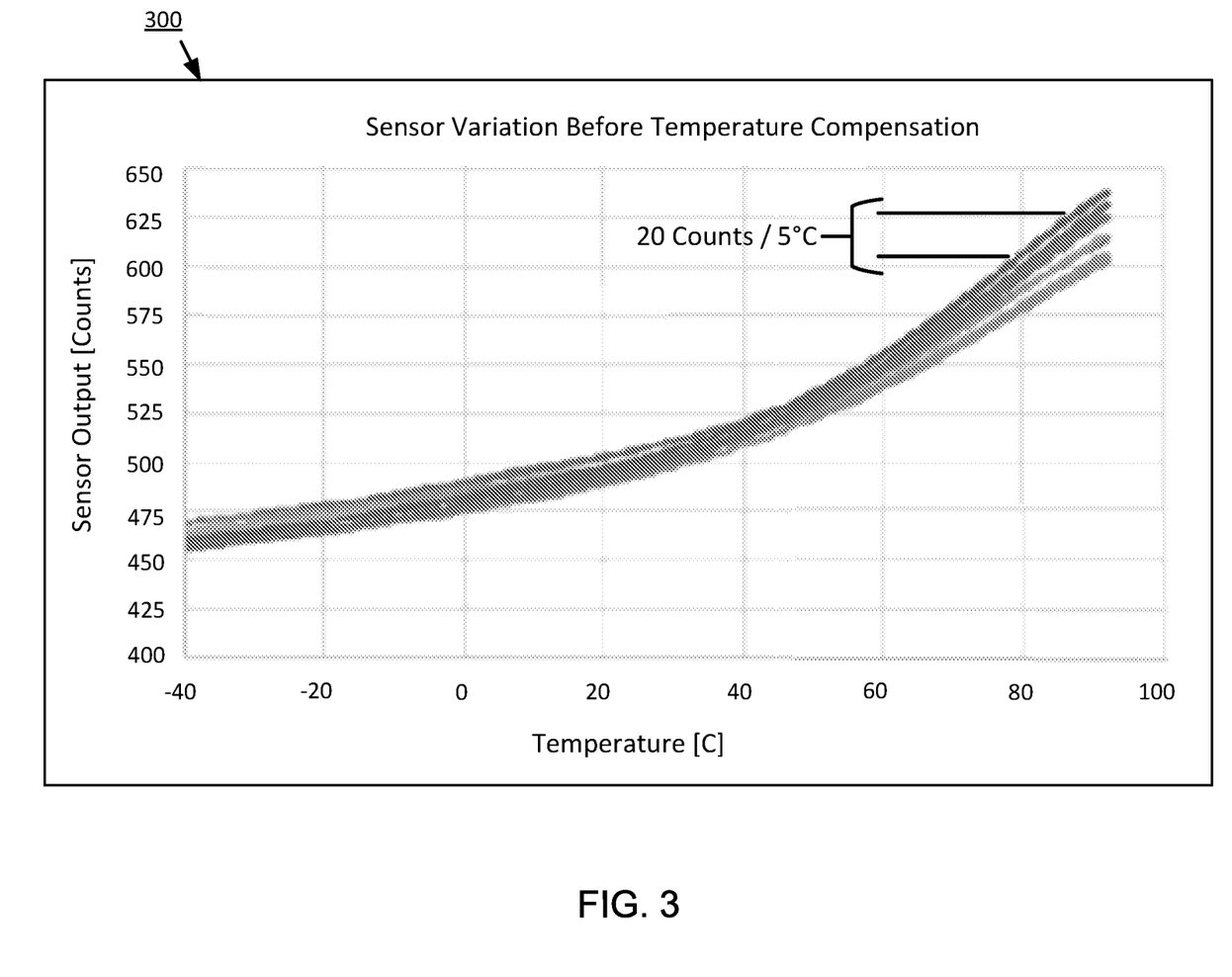
FIG. 3 illustrates an example plot in accordance with embodiments of the present disclosure.
Figure 4:
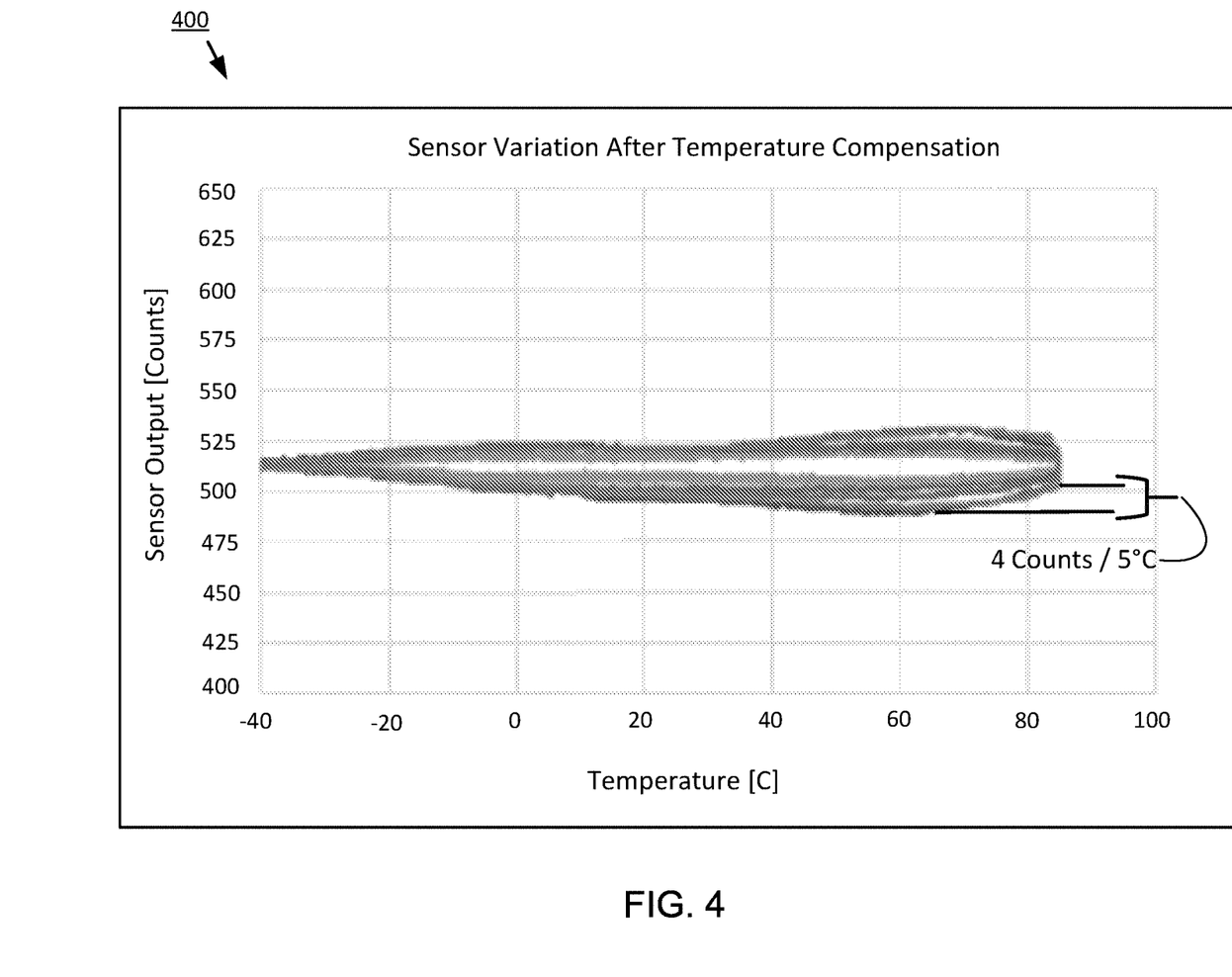
FIG. 4 also illustrates an example plot in accordance with embodiments of the present disclosure.

Referring to FIG. 3, an example plot 300 in accordance with embodiments of the present disclosure is illustrated. The plot 300 may show sensor (e.g., first sensor 110, which may be a capacitive touch sensor) variation before temperature compensation (e.g., as described above) is performed. As shown in the plot 300, prior to the temperature compensation being performed, the sensor output in counts may vary at about 20 counts per 5 degrees Celsius. Referring to FIG. 4, an example plot 400 in accordance with embodiments of the present disclosure is illustrated. The plot 400 may show sensor (e.g., first sensor 110, which may be a capacitive touch sensor) variation after temperature compensation (e.g., as described above is performed). The plot 400 shows that after temperature compensation is performed, the sensor output may vary at about 4 counts per 5 degrees Celsius. Thus, as shown in FIGS. 3-4, the sensor output may vary less after temperature compensation as described herein is performed.

Figure 5:
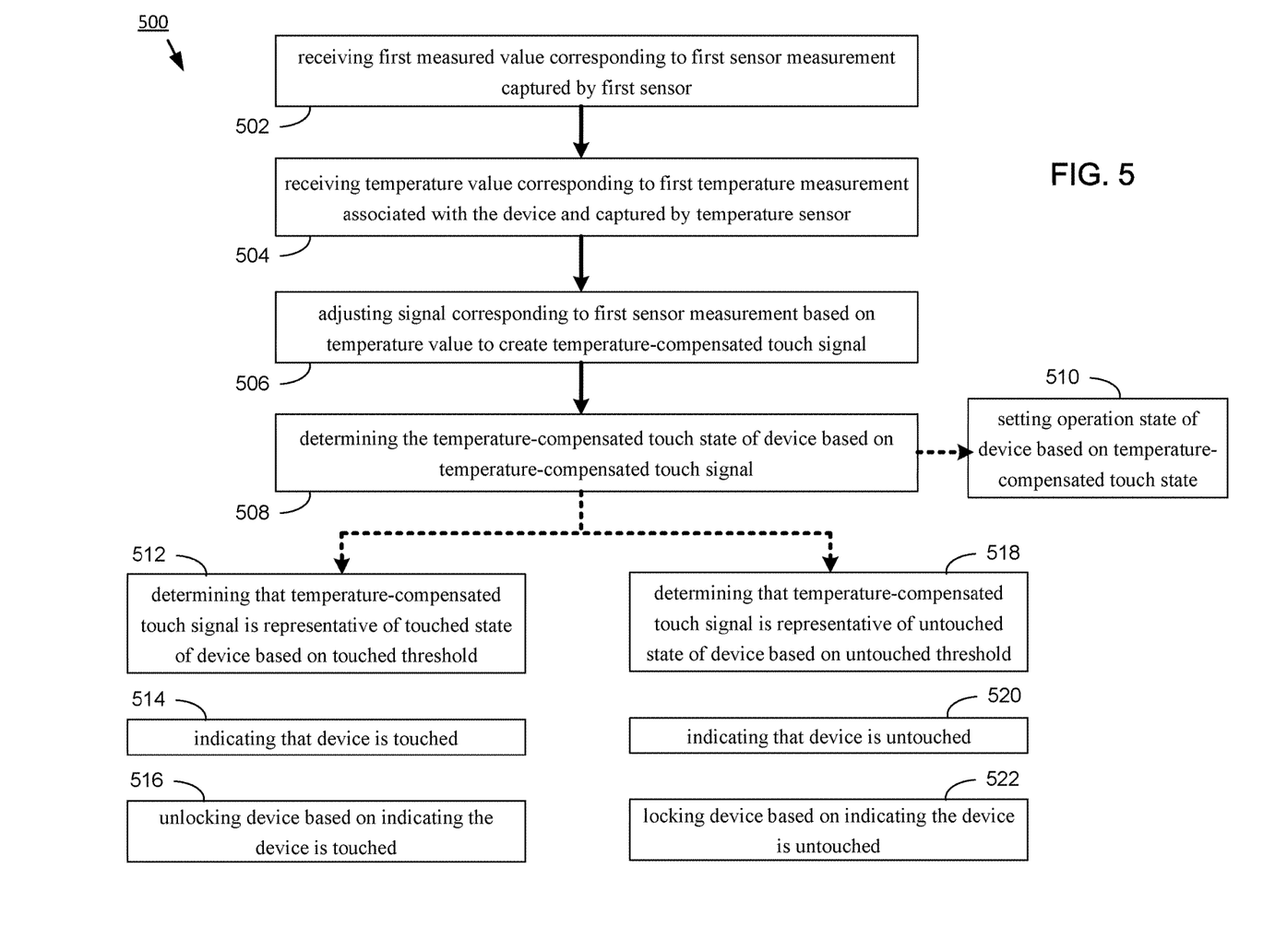
FIG. 5 is a flowchart illustrating example operations in accordance with embodiments of the present disclosure.

Referring to FIG. 5, a flowchart illustrating example operations in accordance with embodiments of the present disclosure is shown. Embodiments of the present disclosure may be directed towards methods for temperature-compensated touch sensing. Further, embodiments of the present disclosure may include a process 500 for determining a temperature-compensated touch state of a device. The device may be an operator-controlled device such as a joystick. The process 500 may include one or more operations that may be performed in part by the processor 130, including, for example, receiving (502), by the processor (e.g., processor 130) of the device and from a first sensor (e.g., first sensor 110) of the device, a first measured value corresponding to a first sensor measurement captured by the first sensor 110. The first sensor 110 may be a capacitive touch sensor and the first measured value may be a capacitive value.

The process 500 may further include receiving (504), by the processor (e.g., processor 130) and from a temperature sensor (e.g., temperature sensor 120) of the device, a temperature value corresponding to a first temperature measurement associated with the device and captured by the temperature sensor (e.g., temperature sensor 120). The process 500 may also include adjusting (506) (or compensating) a signal corresponding to the first sensor measurement based upon, at least in part, the temperature value, to create a temperature-compensated touch signal. The process 500 may additionally include determining (508), by the processor (e.g., processor 130), the temperature-compensated touch state of the device based upon, at least in part, the temperature-compensated touch signal.

In some embodiments, the process 500 may include setting (510), by the processor (e.g., processor 130) an operation state of the device based upon, at least in part, the temperature-compensated touch state. The operation state may be, for example, locked (i.e., no commands provided to downstream machinery or equipment from the operator-controlled device) or unlocked (i.e., commands provided to downstream machinery or equipment from the operator-controlled device).

The process 500 may further include determining (512), by the processor (e.g., processor 130), that the temperature-compensated touch signal is representative of a touched state of the device base upon, at least in part, a touched threshold. The process 500 may also include indicating (514) that the device (e.g., the operator-controlled device) is touched (e.g., by the user or operator). The process 500 may additionally include unlocking (516) the device based upon, at least in part, the indicating (514) that the device is touched. Furthermore, the process 500 may include determining (518), by the processor (e.g., processor 130), that the temperature-compensated touch signal is representative of an untouched state of the device base upon, at least in part, an untouched threshold. Moreover, the process 500 may include indicating (520) that the device is untouched. Also, the process 500 may include locking the device based upon, at least in part, the indicating (520) that the device is untouched. The setting (510) of the operation state of the device based upon, at least in part, the temperature-compensated touch state may be performed during a start-up of the device. The creating of the temperature-compensated touch signal may compensate for a temperature drift associated with the first sensor (e.g., first sensor 110).

Using the techniques and features described herein, embodiments of the present disclosure may provide advantages over existing approaches. Such advantages may include, but are not limited to, more reliable detection of a user or operator presence associated with an operator-controlled device (e.g., detecting that the user or operator is touching the operator-controlled device), which may prevent mistake or unintended use of associated machinery or equipment and/or frustration by the user or operator.

The terminology used herein is for the purpose of describing particular embodiments and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Although a few example embodiments have been described in detail above, those skilled in the art will readily appreciate that many modifications are possible in the example embodiments without materially departing from the scope of the present disclosure, described herein. Accordingly, such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph (f) for any limitations of any of the claims herein, except for those in which the claim expressly uses the words 'means for' or 'step for' together with an associated function.

Having thus described the disclosure of the present application in detail and by reference to embodiments thereof, it will be apparent that modifications and variations are possible without departing from the scope of the disclosure defined in the appended claims.

What is claimed is:

1. A method for determining a temperature-compensated touch state of a device, the method comprising:
    receiving, by a processor of the device and from a first sensor of the device, a first measured value corresponding to a first sensor measurement captured by the first sensor;
    receiving, by the processor and from a temperature sensor of the device, a temperature value corresponding to a first temperature measurement associated with the device and captured by the temperature sensor;
    adjusting a signal corresponding to the first sensor measurement based upon, at least in part, the temperature value, to create a temperature-compensated touch signal;
    determining, by the processor, the temperature-compensated touch state of the device based upon, at least in part, the temperature-compensated touch signal;
    determining, by the processor, that the temperature-compensated touch signal is representative of a touched state of the device based upon, at least in part, the temperature-compensated touch signal minus a baseline delta being above a touched threshold;
    indicating that the device has been touched; and
    unlocking the device after a single touch based upon, at least in part, the indicating that the device has been touched.

2. The method of claim 1, further comprising:
    setting, by the processor, an operation state of the device based upon, at least in part, the temperature-compensated touch state.

3. The method of claim 1, further comprising:
    determining, by the processor, that the temperature-compensated touch signal is representative of an untouched state of the device base upon, at least in part, an untouched threshold; and
    indicating that the device is untouched.

4. The method of claim 3, further comprising:
    locking the device based upon, at least in part, the indicating that the device is untouched.

5. The method of claim 1, wherein the first sensor is a capacitive touch sensor and the first measured value is a capacitive value.

6. The method of claim 1, wherein the device is an operator-controlled device.

7. The method of claim 1, wherein the setting of the operation state of the device based upon, at least in part, the temperature-compensated touch state is performed during a start-up of the device.

8. The method of claim 1, wherein the creating of the temperature-compensated touch signal compensates for a temperature drift associated with the first sensor.

9. A system for determining a temperature-compensated touch state of a device, the system comprising:
- a first sensor of the device for capturing a first sensor measurement;
- a temperature sensor of the device for capturing a first temperature measurement associated with the device;
- a processor of the device, the processor configured to:
  - receive, from the first sensor, a first measured value corresponding to the first sensor measurement;
  - receive, from the temperature sensor, a temperature value corresponding to the first temperature measurement associated with the device;
  - cause a signal corresponding to the first sensor measurement to be adjusted based upon, at least in part, the temperature value, to create a temperature-compensated touch signal;
  - determine the temperature-compensated touch state of the device based upon, at least in part, the temperature-compensated touch signal;
  - determine that the temperature-compensated touch signal is representative of a touched state of the device base upon, at least in part, the temperature-compensated touch signal minus a baseline delta being above a touched threshold;
  - indicate that the device is touched;
  - cause the device to be unlocked after a single touch based upon, at least in part, the indication that the device is touched.

10. The system of claim 9, wherein the processor is further configured to:
- change a setting of the device based upon, at least in part, the temperature-compensated touch state.

11. The system of claim 9, wherein the processor is further configured to:
- determine that the temperature-compensated touch signal is representative of an untouched state of the device base upon, at least in part, an untouched threshold; and
- indicate that the device is untouched.

12. The system of claim 9, wherein the processor is further configured to:
- cause the device to be locked based upon, at least in part, the indication that the device is untouched.

13. The system of claim 9, wherein the first sensor is a capacitive touch sensor and the first measured value is a capacitive value.

14. The system of claim 9, wherein the device is an operator-controlled device.

15. The system of claim 9, wherein the setting of the operation state of the device based upon, at least in part, the temperature-compensated touch state is performed during a start-up of the device.

* * * * *